US009923160B2

(12) United States Patent
Cao et al.

(10) Patent No.: US 9,923,160 B2
(45) Date of Patent: Mar. 20, 2018

(54) METHOD OF ASSEMBLING CARBON NANOTUBES OF A SEMICONDUCTOR DEVICE VIA FRINGING FIELD ASSISTED DIELECTROPHORESIS

(71) Applicant: International Business Machines Corporation, Armonk, NY (US)

(72) Inventors: Qing Cao, Yorktown Heights, NY (US); Kangguo Cheng, Schenectady, NY (US); Shu-Jen Han, Cortlandt Manor, NY (US); Zhengwen Li, Scarsdale, NY (US); Fei Liu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 17 days.

(21) Appl. No.: 15/090,762

(22) Filed: Apr. 5, 2016

(65) Prior Publication Data

US 2016/0218306 A1    Jul. 28, 2016

Related U.S. Application Data

(62) Division of application No. 14/615,554, filed on Feb. 6, 2015, now Pat. No. 9,525,147.

(Continued)

(51) Int. Cl.
*H01L 51/05* (2006.01)
*H01L 51/00* (2006.01)
(Continued)

(52) U.S. Cl.
CPC ........ *H01L 51/0545* (2013.01); *H01L 27/283* (2013.01); *H01L 51/0006* (2013.01); *H01L 51/0017* (2013.01); *H01L 51/0021* (2013.01); *H01L 51/0048* (2013.01); *H01L 51/055* (2013.01); *H01L 51/0558* (2013.01); *H01L 51/105* (2013.01)

(58) Field of Classification Search
None
See application file for complete search history.

(56) References Cited

U.S. PATENT DOCUMENTS 4,853,341 A * 8/1989 Nishioka ........... H01L 21/76877
                                                 148/DIG. 131
4,868,138 A * 9/1989 Chan ................. H01L 21/28518
                                                 257/E21.165

(Continued)

OTHER PUBLICATIONS

List of IBM Patents or Patent Applications Treated as Related; (Appendix P), Filed Apr. 5, 2016; 2 pages.

*Primary Examiner* — Bilkis Jahan
(74) *Attorney, Agent, or Firm* — Cantor Colburn LLP; Vazken Alexanian

(57) ABSTRACT

A method of arranging at least one carbon nanotube on a semiconductor substrate includes depositing the at least one carbon nanotube on a dielectric layer of the semiconductor device. The method further includes arranging the at least one carbon nanotube on the dielectric layer in response to applying a voltage potential to an electrically conductive electrode of the semiconductor device, and applying a ground potential to an electrically conductive semiconductor layer of the semiconductor device.

7 Claims, 15 Drawing Sheets

Related U.S. Application Data

(60) Provisional application No. 62/055,337, filed on Sep. 25, 2014.

(51) Int. Cl.
  *H01L 27/28* (2006.01)
  *H01L 51/10* (2006.01)

(56) References Cited

U.S. PATENT DOCUMENTS

| | | | | |
|---|---|---|---|---|
| 5,985,734 A * | 11/1999 | Hahn | ............... | H01L 21/76202 257/E21.552 |
| 6,200,845 B1 * | 3/2001 | Iwasaki | ............... | H01L 28/91 257/E21.019 |
| 7,521,859 B2 * | 4/2009 | Park | ............... | H01L 27/3276 313/504 |
| 7,525,143 B2 * | 4/2009 | Chae | ............... | H01L 27/10894 257/306 |
| 7,782,416 B2 * | 8/2010 | Seo | ............... | H01L 27/283 349/47 |
| 7,791,186 B2 * | 9/2010 | Kikuchi | ............... | H01L 21/6835 257/693 |
| 2005/0040371 A1 * | 2/2005 | Watanabe | ............... | B82Y 10/00 252/500 |
| 2005/0127030 A1 * | 6/2005 | Watanabe | ............... | B82Y 30/00 216/41 |
| 2006/0118777 A1 * | 6/2006 | Hirakata | ............... | B82Y 10/00 257/39 |
| 2006/0243708 A1 * | 11/2006 | Ikenoue | ............... | B23K 26/032 219/121.62 |
| 2007/0207622 A1 * | 9/2007 | Rana | ............... | C09K 13/08 438/745 |
| 2011/0089404 A1 * | 4/2011 | Marcus | ............... | B82Y 30/00 257/29 |
| 2014/0154469 A1 * | 6/2014 | Kagawa | ............... | H05K 9/0088 428/155 |
| 2016/0093819 A1 | 3/2016 | Cao et al. | | |

\* cited by examiner

US 9,923,160 B2

1

METHOD OF ASSEMBLING CARBON NANOTUBES OF A SEMICONDUCTOR DEVICE VIA FRINGING FIELD ASSISTED DIELECTROPHORESIS

DOMESTIC PRIORITY

This application is a divisional application of U.S. patent application Ser. No. 14/615,554, filed Feb. 6, 2015, which is a non-provisional application of U.S. Patent Application Ser. No. 62/055,337, filed Sep. 25, 2014, the disclosures of which are incorporated by reference herein in their entireties.

BACKGROUND

The present invention relates to semiconductor fabrication, and more specifically, to carbon nanotube semiconductor device fabrication.

Current semiconductor fabrication is trending toward the use of carbon nanotubes (CNTs) as semiconductor device sizes decrease. Dielectrophoresis is a phenomenon in which a force is exerted on a dielectric particle when it is subjected to a non-uniform electric field, and has been used to arrange multilayers of CNTs, with either a low density or a higher density, into stacked arrangements. Multi-layer CNTs, however, cannot be utilized in semiconductor transistor devices because the multi-layer arrangement causes a screening effect that inhibits the gate electric field and prevents proper control of the transistor gate. Consequently, conventional dielectrophoresis methods have been unable assemble CNTs to achieve a desirable CNT pitch separation while avoiding multi-layer CNT formation.

SUMMARY

According to at least one non-limiting embodiment of the present invention, a method of arranging at least one carbon nanotube on a semiconductor substrate includes depositing the at least one carbon nanotube on a dielectric layer of the semiconductor device. The method further includes arranging the at least one carbon nanotube on the dielectric layer in response to applying a voltage potential to an electrically conductive electrode of the semiconductor device, and applying a ground potential to an electrically conductive semiconductor layer of the semiconductor device.

According to another non-limiting embodiment, a method of fabricating a semiconductor device comprises forming a dielectric layer on an upper surface of a conductive substrate, and forming a single contiguous electrode on the dielectric layer. The method further includes forming a conformal dielectric film on an upper surface of the electrode and on an upper surface of the dielectric layer, and performing a selective etching process that exposes a portion of the electrode and a portion of the conductive substrate.

According to still another non-limiting embodiment, a semiconductor device comprises a substrate including a conductive layer and a dielectric layer on an upper surface of the conductive layer. An electrically conductive contact layer is on an upper surface of the dielectric layer. The semiconductor device further includes a dielectric film on the contact layer. The dielectric film defines an insulating portion of the contact layer and an exposed portion of the contact layer which defines a first electrical potential contact point. The dielectric film and the dielectric layer have an

2 opening formed therethrough that exposes a portion of the conductive semiconductor layer that defines a second electrical potential contact point.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings.

FIGS. 1-11 are a series of cross sectional views illustrating a process flow of forming a semiconductor device according to a non-limiting embodiment in which:

FIG. 1 is a cross-sectional diagram of a starting semiconductor substrate including a dielectric layer formed on an upper surface of a bulk conductive layer;

FIG. 2 illustrates the semiconductor substrate of FIG. 1 following deposition of a metal layer on an upper surface of the dielectric layer;

FIG. 3 illustrates the semiconductor substrate of FIG. 2 following deposition of a masking layer on an upper surface of the metal layer;

FIG. 4 illustrates the semiconductor substrate of FIG. 3 after patterning the masking layer to expose a portion of the underlying metal layer;

FIG. 5 illustrates the semiconductor substrate of FIG. 4 after etching the exposed metal layer to expose a portion of the underlying dielectric layer;

FIG. 6 illustrates the semiconductor substrate of FIG. 5 following removal of the remaining masking layer to define a semiconductor device including an electrode;

FIG. 7 illustrates the semiconductor device of FIG. 6 after depositing a conformal dielectric film on an upper surface of the electrode and the exposed dielectric layer;

FIG. 8 illustrates the semiconductor device of FIG. 7 following deposition of a second masking layer on an upper surface of the conformal dielectric film;

FIG. 9 illustrates the semiconductor device of FIG. 8 after patterning the second masking layer;

FIG. 10 illustrates the semiconductor device of FIG. 9 after etching a first portion of the dielectric film to expose a portion of the electrode and after etching a second portion of the dielectric film and the dielectric layer to expose a portion of the conductive layer;

FIG. 11 illustrates the semiconductor device of FIG. 10 after removing the second masking layer to define a semiconductor device configured to perform a dielectrophoresis process that self-aligns CNTs deposited on an upper surface of the dielectric film using a single electrode and the conductive layer;

DETAILED DESCRIPTION

According to at least one non-limiting embodiment, a method of fabricating a semiconductor device includes forming aligned carbon nanotubes (CNTs) such as, for example, single-walled carbon nanotubes (SWNTs), into sub-monolayer aligned arrays having both tight and uniform pitch separation. Unlike conventional methods which use pairs of coplanar metal electrodes formed on a substrate to arrange stacked multi-layer CNTs, at least one non-limiting embodiment of the invention forms aligned carbon nanotubes into sub-monolayer aligned arrays with both tight and uniform pitch separation in response to performing alternating current (AC) dielectrophoresis to align carbon nanotubes using only a single electrode (e.g., a single contiguous metal bar electrode) and the conductive substrate (e.g., silicon).

Another feature of the invention includes self-aligning a plurality of carbon nanotubes into monolayer aligned arrays with both tight and uniform pitch separation. The self-aligning arrangement is achieved in response to performing alternating current (AC) dielectrophoresis to align CNTs using only a single electrode (e.g., a single metal bar electrode) formed on a conductive substrate and the conductive substrate. According to an embodiment, the self-limiting of CNTs applies to both self-limiting alignment and self-limiting pitch separation. According to another non-limiting embodiment, a plurality of CNTs such as, for example, single-walled carbon nanotubes (SWNTs) are self-aligned into sub-monolayer aligned arrays with both tight and uniform pitch separation to form gate channels of a semiconductor device.

Figure 1:
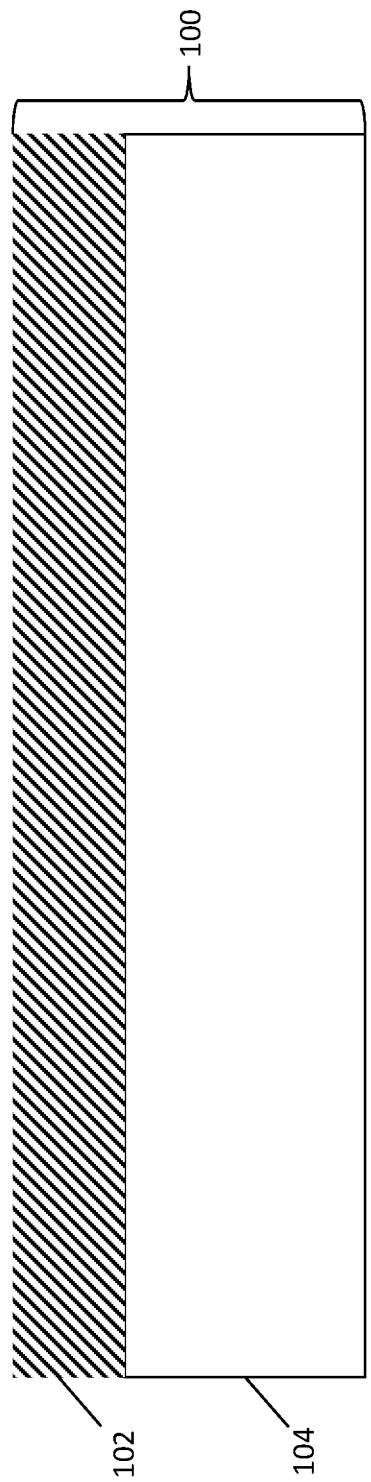

With reference now to FIG. 1, a starting substrate 100 is illustrated according to a non-limiting embodiment. The starting substrate 100 includes a dielectric layer 102 formed on an upper surface of a bulk conductive substrate layer 104. The dielectric layer 102 comprises, for example, silicon dioxide ($SiO_2$), and has a thickness ranging, for example, from approximately 10 nanometers (nm) to approximately 1000 nm. The conductive substrate layer 104 comprises an electrically conductive material. Various methods may be used to deposit the dielectric layer 102 on the conductive substrate layer 104 including, but not limited to, a chemical vapor deposition (CVD) process, and an atomic layer deposition (ALD) process. The electrically conductive material may include, but is not limited to, a semiconductor material such as, for example, silicon (Si) or doped Si. The silicon may be heavily doped, e.g. dopant concentration above $10^{17}$ $cm^{-3}$ such that the conductive layer has metal-like electrically conductive properties.

Figure 2:
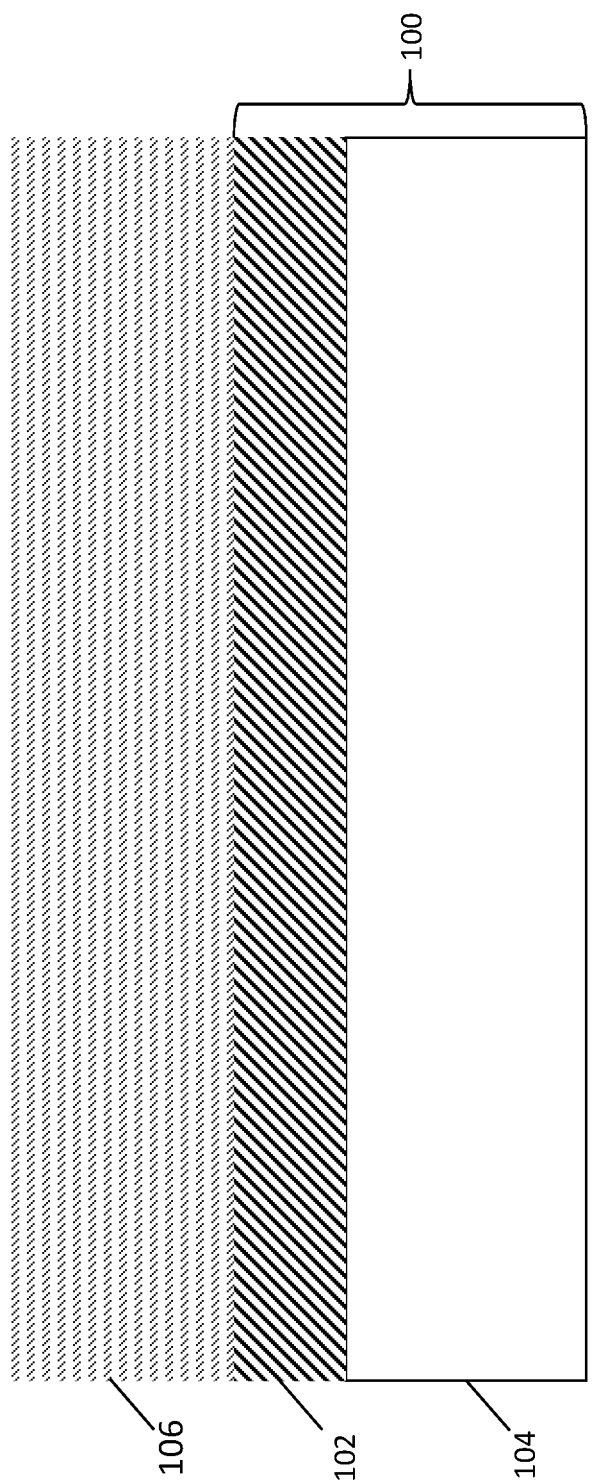

Turning to FIG. 2, the starting substrate 100 is illustrated after depositing a bulk contact layer 106 on an upper surface of the dielectric layer 102. The contact layer 106 is formed from various electrically conductive materials including, but not limited to, gold (Au) and copper (Cu). The contact layer 106 has a thickness ranging, for example, from approximately 5 nm to approximately 100 nm. Various deposition processes may be used to deposit the contact layer 106 including, but not limited to, a CVD process, a thermal evaporation process, and a sputtering process.

Figure 3:
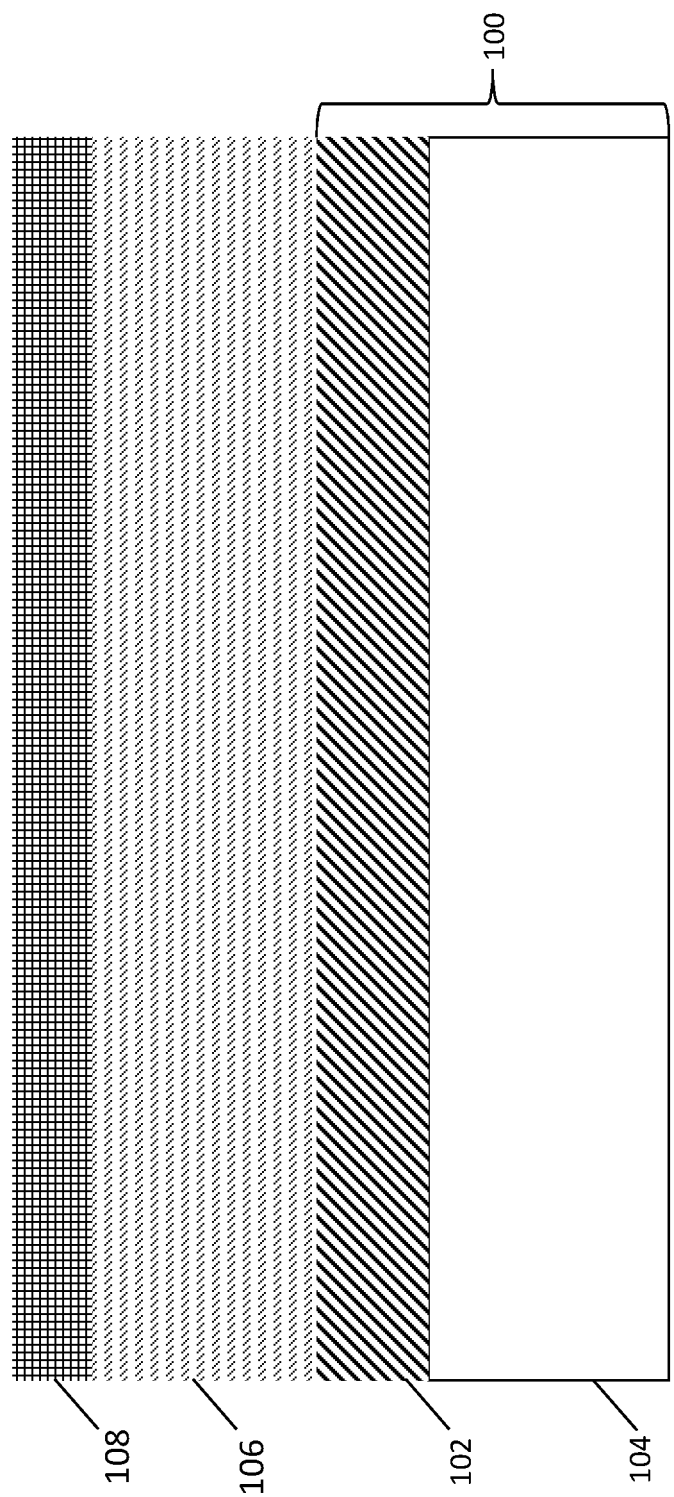

Turning to FIG. 3, a masking layer 108 is formed on an upper surface of the contact layer 106. The masking layer 108 may include, but is not limited to, a polymer photoresist material, or a hard mask layer. The polymer photoresist material may comprise various well-known light-sensitive organic materials, and can be deposited on the contact layer 106 using, for example, a spin coating deposition process. The hard mask layer may comprise, for example, silicon nitride (SiN), and can be deposited using a CVD process. The masking layer 108 has a thickness ranging, for example, from approximately 5 nm to approximately 50 nm.

Figure 4:
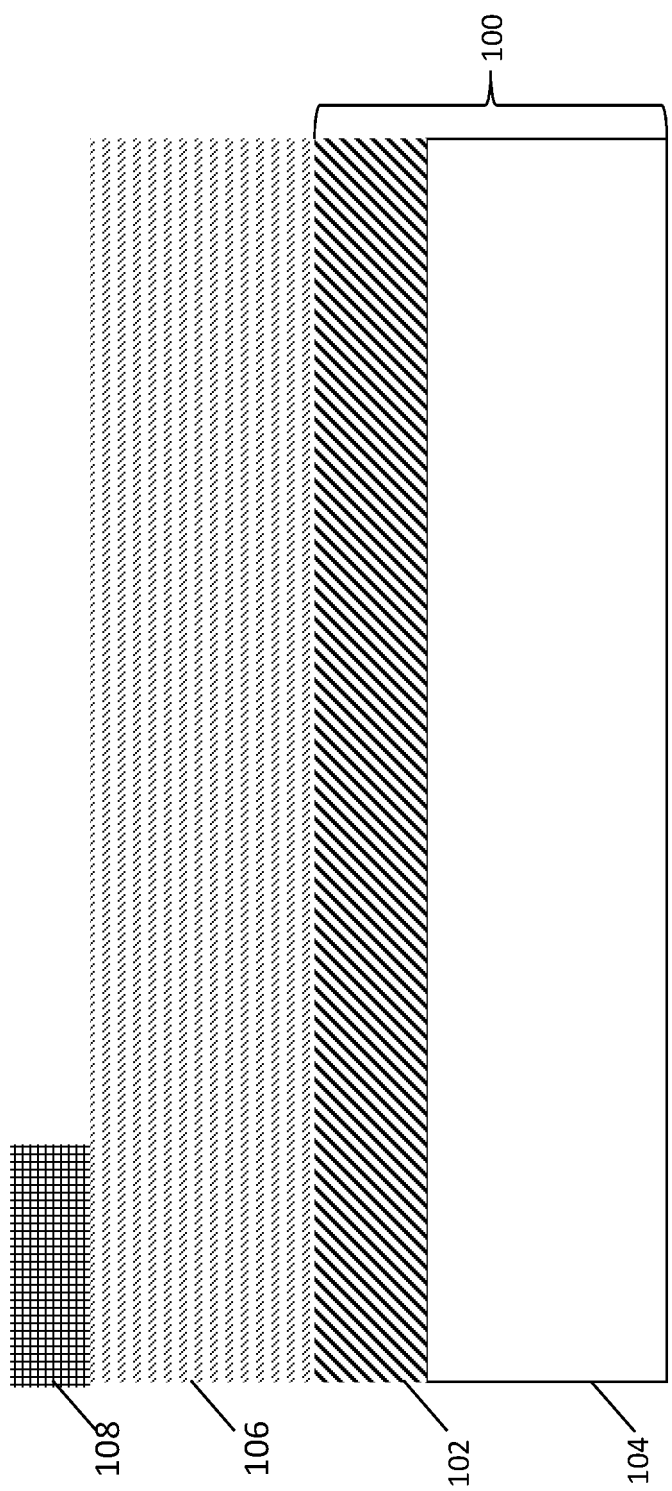

Referring to FIG. 4, the masking layer 108 is illustrated following a patterning process that exposes a portion of the underlying contact layer 106. Various patterning processes may be used to pattern the masking layer 108 as understood by one of ordinary skill in the art. If the masking layer 108 comprises a light sensitive photomask, for example, well-known photolithography patterning methods may be used. When the masking layer 108 comprises a hardmask material, for example, a plasma etching process that is selective to the hardmask material can be used.

Figure 5:
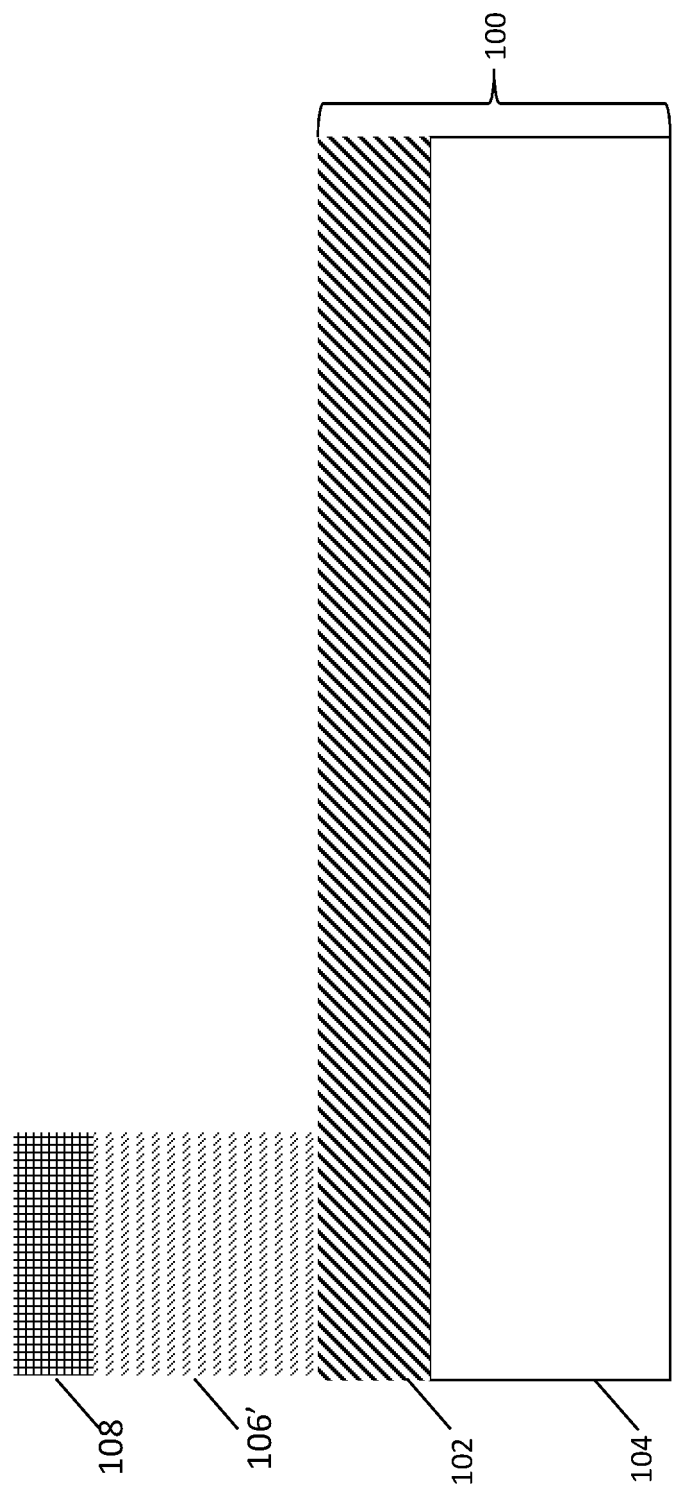
Figure 6:
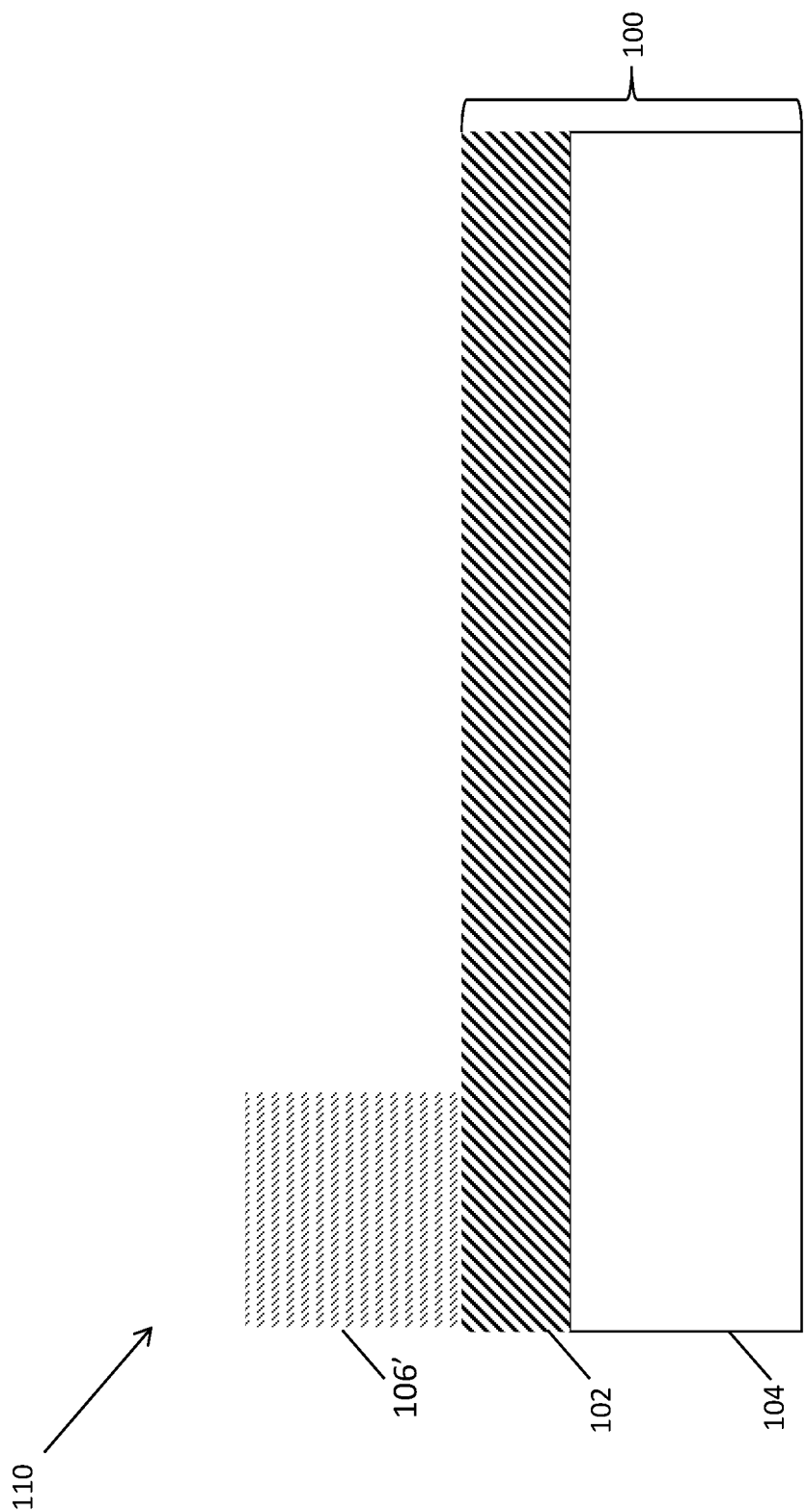

Referring now to FIG. 5, the exposed portion of the contact layer 106 is selectively etched. Various well-known etching processes for patterning the metal layer can be used including, but not limited to, a reactive ion etching (ME) process and a chemical etching processes. After completing the etching process, a portion of the underlying dielectric layer 102 is exposed, while the covered portion of the contact layer 106 is left remaining on an upper surface of the dielectric layer 102. In this manner, the remaining contact layer defines an electrode 106' (e.g., a single contiguous metal bar electrode 106', or a contiguous metal bar electrode 106' with integral contact branches) that can be used a first electrical contact point. In this manner, the electrode 106' can be utilized to achieve a self-limiting assembly of one or more CNTs (not shown in FIG. 6). For example, the electrode 106' can be utilized to receive a voltage potential such as, for example, an AC voltage (V), which self-aligns one or more CNTs as described in greater detail below. Following formation of the electrode 106', the remaining masking layer 108 can be removed using various methods understood by one of ordinary skill in the art. Accordingly, a semiconductor device 110 including an electrode 106' on a dielectric layer 102 is formed as illustrated in FIG. 6.

Figure 7:
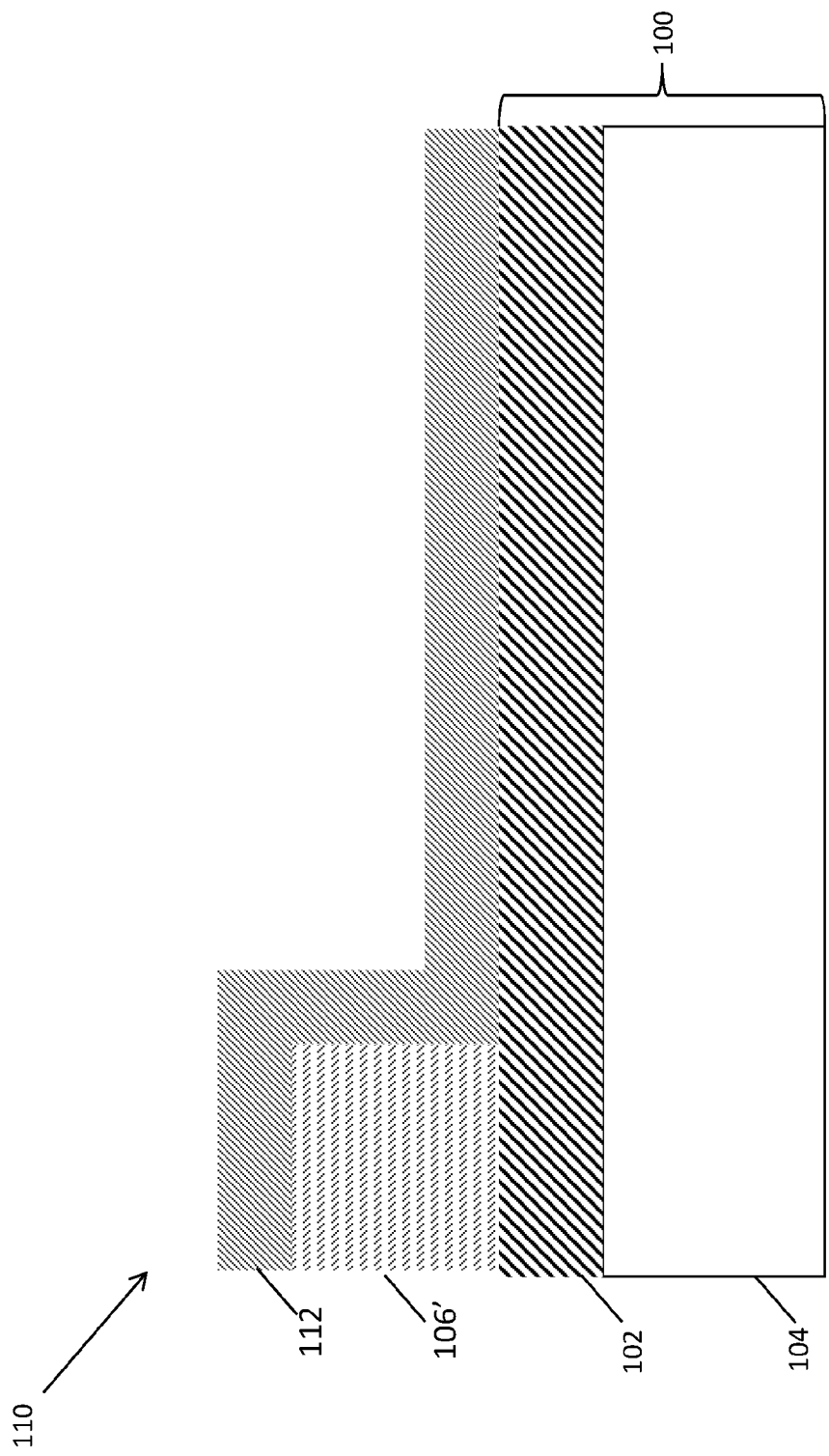

Referring to FIG. 7, an assembled device 110 is illustrated after depositing a conformal dielectric film 112 on an upper surface of the electrode 106' and the exposed dielectric layer 102. Various methods may be used to deposit the conformal dielectric film 112 including, but not limited to, an ALD process, a CVD process, an electric beam (e-beam) vaporization process, and a sputtering process. The conformal dielectric film 112 comprises, for example, aluminum oxide ($Al_2O_3$), and has a thickness ranging, for example, from approximately 10 nm to approximately 1000 nm. Although Al$_2$O$_3$ is described, it should be appreciated that various other dielectric materials may be used including, but not limited to, SiO$_2$, hafnium oxide (HfO$_2$), and silicon nitride (SiN). As described in greater detail below, a solution containing a plurality of CNTs (not shown in FIG. 7) can be deposited on the upper surface of the conformal dielectric film 112. Accordingly, the conformal dielectric film 112 can be used to electrically isolate each carbon nanotube from electrode 106.

Figure 8:
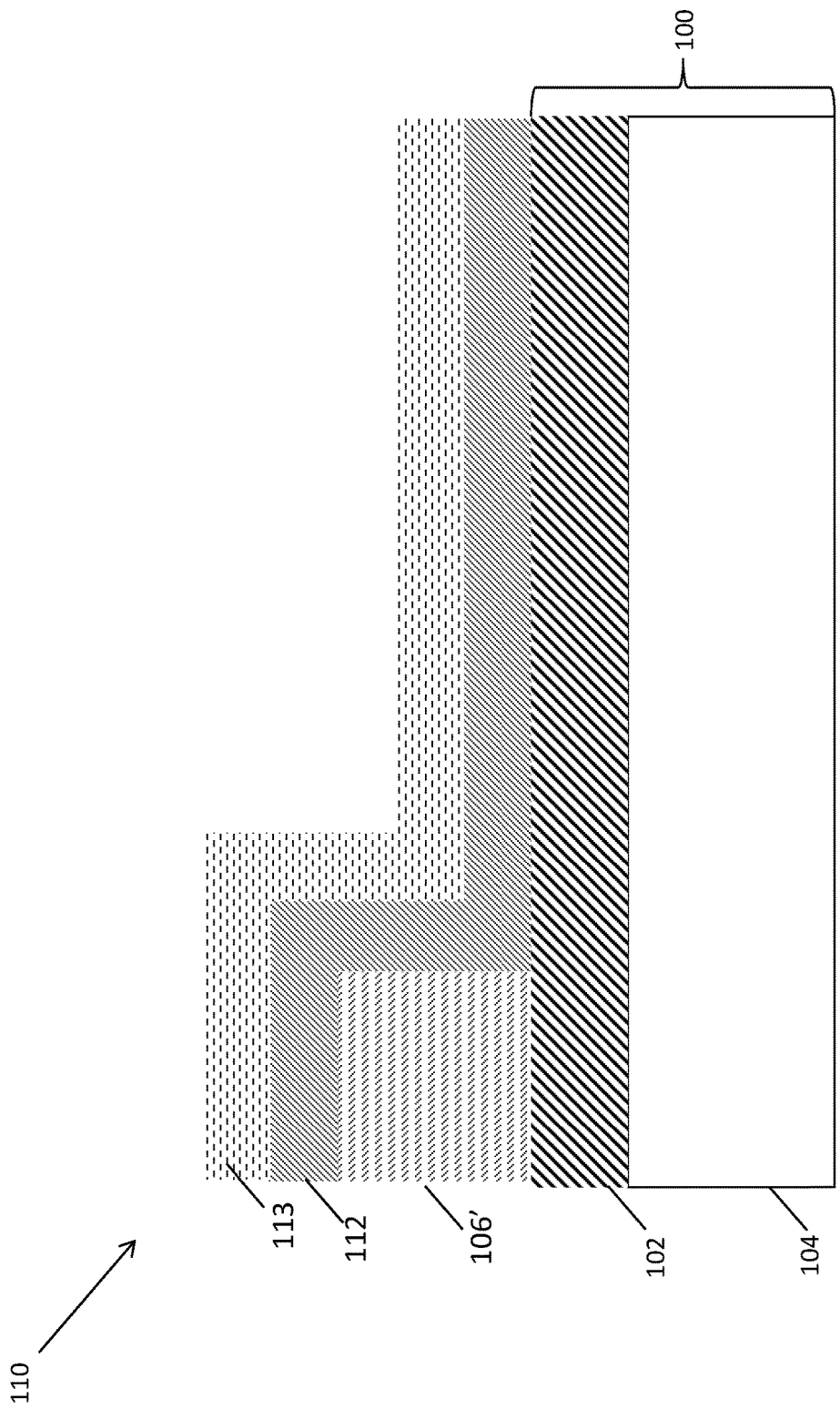

Turning to FIG. 8, a second masking layer 113 is deposited on an upper surface of the conformal dielectric film 112. The second masking layer 113 comprises, for example, an organic light-sensitive photomask material as understood by one of ordinary skill in the art. The second masking layer 113 can be deposited using various processes including, for example, a well-known spin coating process.

Figure 9:
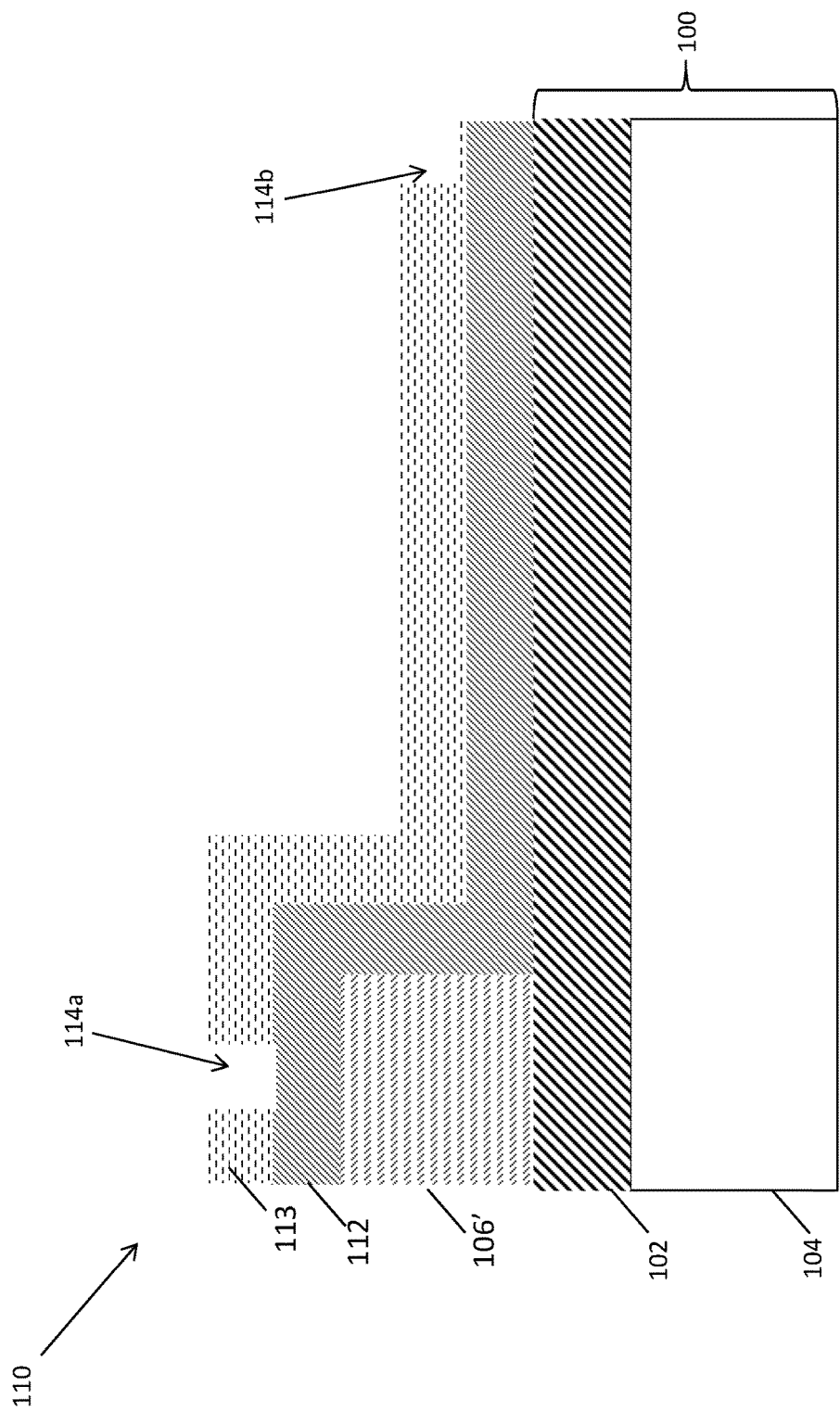

Referring to FIG. 9, the second masking layer 113 is illustrated following a patterning process that forms one or more patterns 114a-114b therein. For example, a first pattern 114a is formed in the masking layer 113 and exposes a first portion of the underlying dielectric film 112, while a second pattern 114b is formed in the masking layer 113 and exposes a second portion of the underlying dielectric film 112. Various photolithography process understood by one of ordinary skill in the art can be used to pattern the second masking layer 113.

Figure 10:
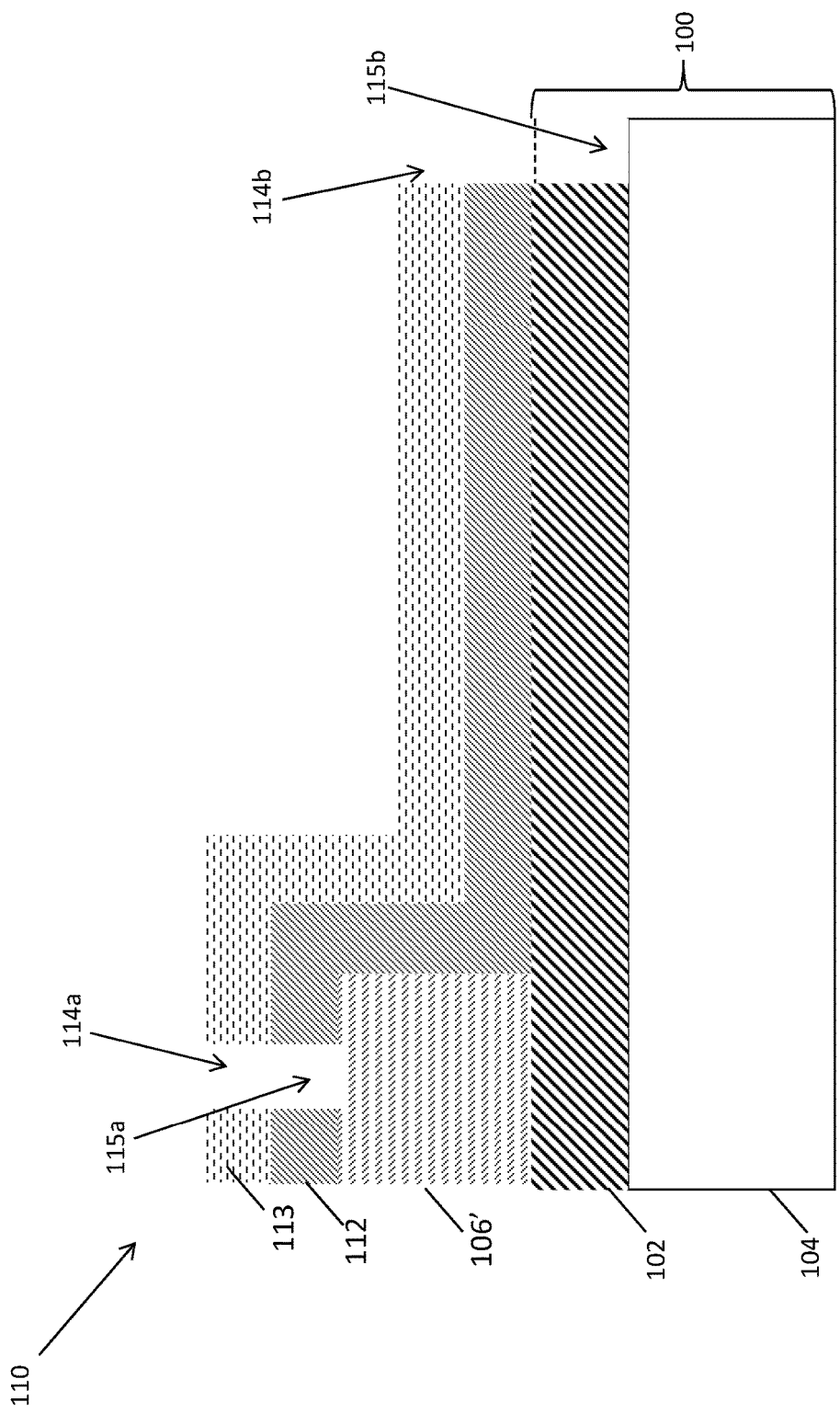

With reference now to FIG. 10, the device 110 is illustrated after transferring the patterns 114a-114b into the underlying dielectric material. Various etching process selective to dielectric materials (e.g., SiO$_2$, Al$_2$O$_3$, etc.) can be used to transfer the patterns 114a-114b. In this manner, a first opening 115a that exposes a portion of the electrode the electrode 106' is formed in a first portion of the dielectric film 112. Similarly, a second opening 115b that exposes a portion of the conductive substrate 104' is formed in a second portion of the conformal dielectric film 112 and also a portion of the dielectric layer 102. Since the etching process is selective to dielectric material, the first opening 115a extends through the dielectric film 112 and stops on the upper surface of the electrode 106', while the second opening 115b extends through both the dielectric film 112 and the dielectric layer 102 but stops on the upper surface of the conductive substrate 104. Using an etching process that is selective to dielectric material also achieves simultaneous formation of the first opening 115a and the second opening 115b using only a single etching process.

Figure 11:
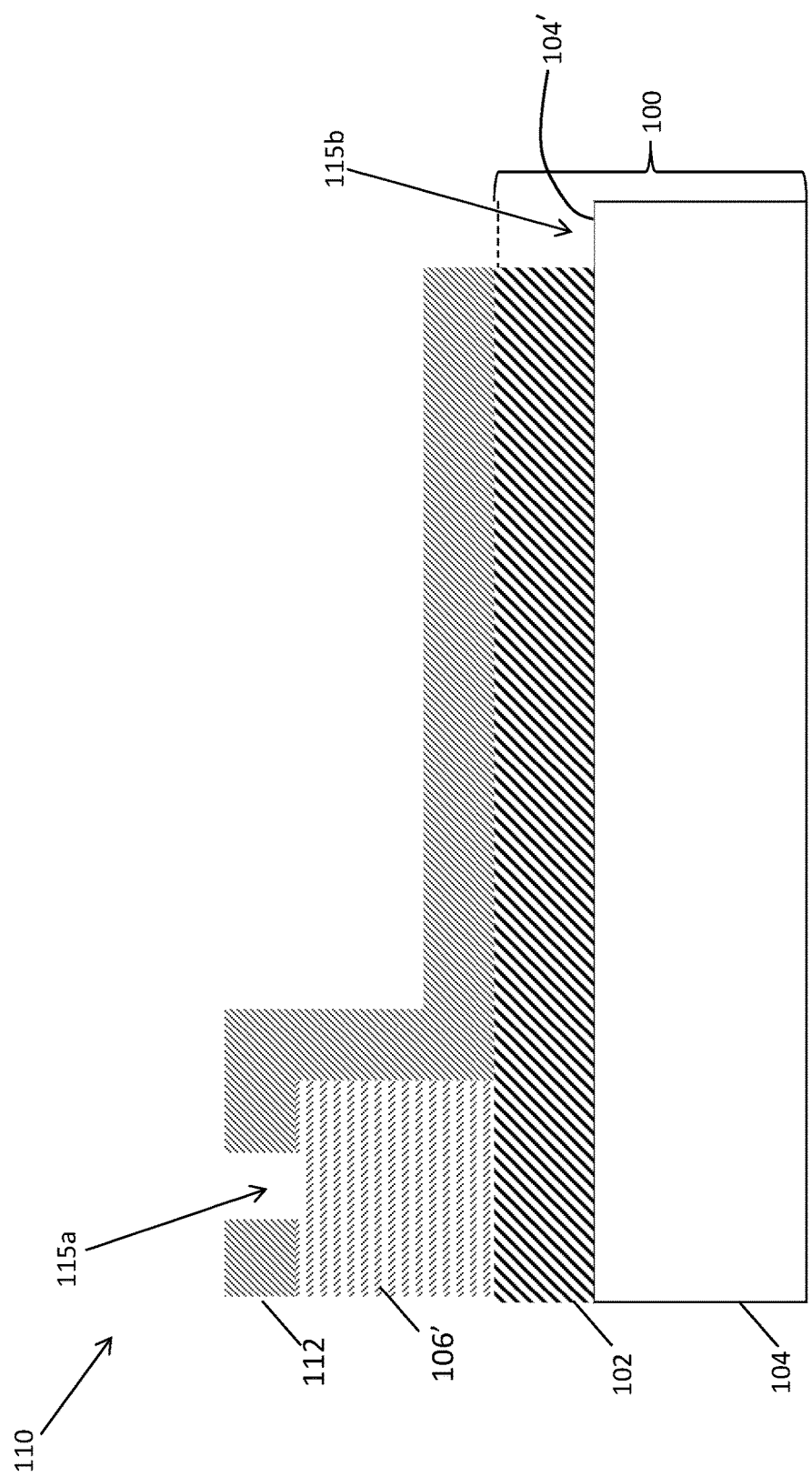

Turning now to FIG. 11, the second masking layer 113 is selectively removed while the conformal dielectric film 112 is maintained. Accordingly, the first opening 115a allows access to the electrode 106' and the second opening 115b allows access to a portion of the conductive substrate 104' (e.g., an accessible portion of silicon). As mentioned above, the exposed electrode 106' is configured as a first electrical contact point. Unlike conventional devices, however, the conductive substrate 104 (e.g., silicon substrate) is configured as a second electrical contact point. According to an embodiment, the entire conductive substrate 104 is configured as a second electrode (e.g., silicon electrode) electrode. In this manner, the device 10 is in condition to perform an electrical dielectrophoresis process (e.g., AC dielectrophoresis) to align CNTs (not shown in FIG. 9) using only the electrode 106' (e.g., a single contiguous metal bar electrode including contact branches) and the conductive substrate 104 (e.g., silicon substrate). For example, the exposed portion of the electrode 106' is configured to receive an AC voltage, while the conductive substrate 104 (e.g., Si substrate) defines a ground contact configured to receive a ground potential.

The dielectrophoresis phenomenon is based on a well-known physical principle that occurs when a particle in a medium has a higher effective dielectric constant (which includes the real dielectric constant and conductivity terms) than the medium. In these conditions, the particle experiences a positive dielectrophoretic force that brings it into the higher electric field region. The dielectric force originates from the interaction between the non-uniform electric field and the induced dipole in the dielectric particle. In at least one non-limiting embodiment of the invention, the particles are a plurality of SWNTs contained in a solution medium deposited at a targeted location on the upper surface of the conformal dielectric layer 112. After depositing the nanotube solution containing a plurality of SWNTs, an AC voltage (V) is applied to the electrode 106', while a ground potential is applied to the conductive substrate 104. In response to the AC voltage potential, a dielectrophoretic force is induced such that the plurality of SWNTs are self-limited into monolayer-aligned arrays with both tight and uniform pitch separation. Therefore, the SWNTs self-limit themselves into alignment using only a single electrode 106' (e.g., a single contiguous metal bar electrode) and the conductive substrate 104 (e.g., silicon substrate).

Figure 12:
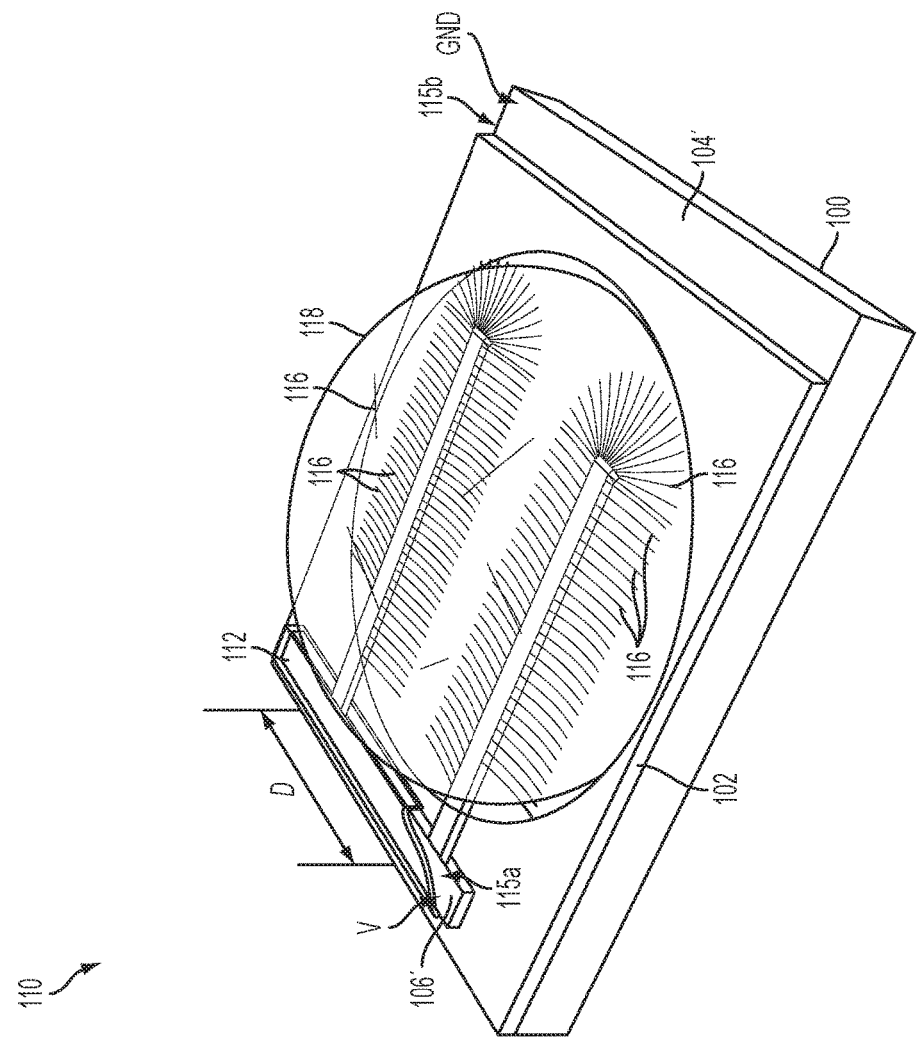
FIG. 12 illustrates a semiconductor device performing a dielectrophoresis process using a single electrode and the conductive layer of the substrate to self-align a plurality of CNTs according to a non-limiting embodiment of the invention.

Referring now to FIG. 12, a device 110 is illustrated performing self-limiting arrangement of a plurality of CNTs 116 such as, for example, SWNTs, contained in a nanotube solution 118. More specifically, the device 110 includes a conformal dielectric film 112 formed on an upper surface of a semiconductor substrate 100 as described in detail above. A nanotube solution 118 containing a plurality of CNTs 116 is deposited on an upper surface on the dielectric film 112. A voltage (V) such as, for example, an AC voltage provided by an AC voltage supply, is applied to an electrode 106' which is exposed via an opening formed through the conformal dielectric film 112. A ground potential (GND) is applied to the conductive substrate 104. In turn, an AC electric field formed as a fringing field is formed between the upper surface of the single electrode 106' and the entire conductive layer 104. The fringing field induces a dielectrophoretic force that self-aligns the plurality of CNTs 116 with respect to one another.

According to at least one embodiment, the fringing field generated between the upper surface of the single electrode 106' and the entire conductive layer 104 self-aligns the CNTs 116 into monolayer-aligned arrays having both tight and uniform pitch separation. FIG. 13A shows the alignment force generated from a conventional dielectrophoresis processes (dashed line) versus the alignment force generating from a dielectrophoresis processes according to at least one embodiment of the invention (solid line). Prior to depositing CNTs on the semiconductor device 110, the dielectrophoresis processes using a single electrode and the conductive layer of the substrate (e.g., silicon substrate layer) according to at least one embodiment generates an alignment force that is several times higher than the alignment force generated when using two separate metal electrodes.

Figure 13B:
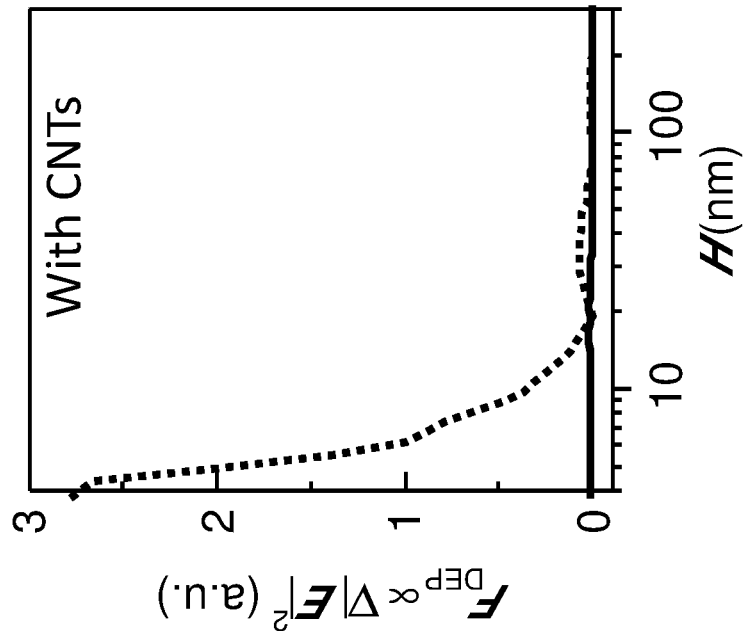
FIG. 13B is a graph illustrating the screening effect realized by neighboring CNTs when performing a conventional dielectrophoresis process using two separate metal electrodes versus the screening effect realized by neighboring CNTs when performing a dielectrophoresis process using a single electrode and the conductive layer of the substrate according to at least one embodiment of the invention.
Figure 13A:
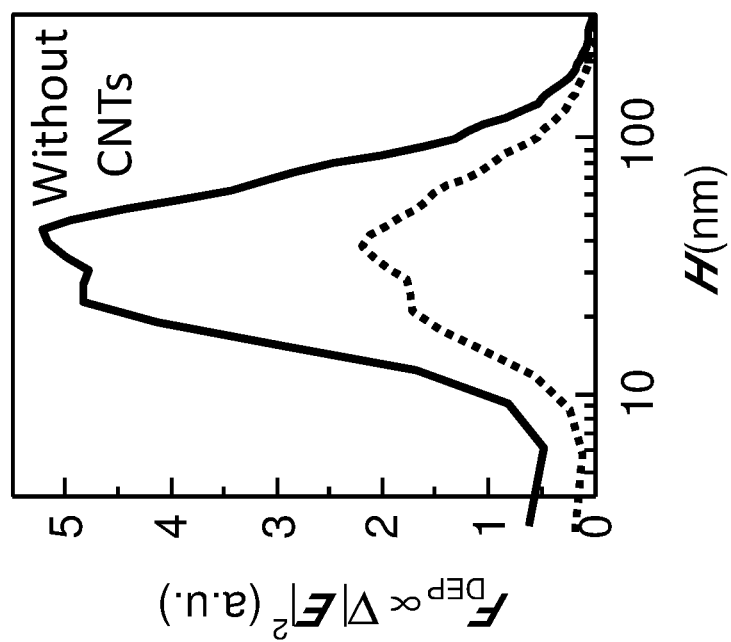
FIG. 13A is a graph illustrating the self-limiting attractive forces generated by conventional dielectrophoresis process using two separate metal electrodes versus the self-limiting attractive forces generated by a dielectrophoresis process using a single electrode and the conductive layer of the substrate according to at least one embodiment of the invention.
Figure 14:
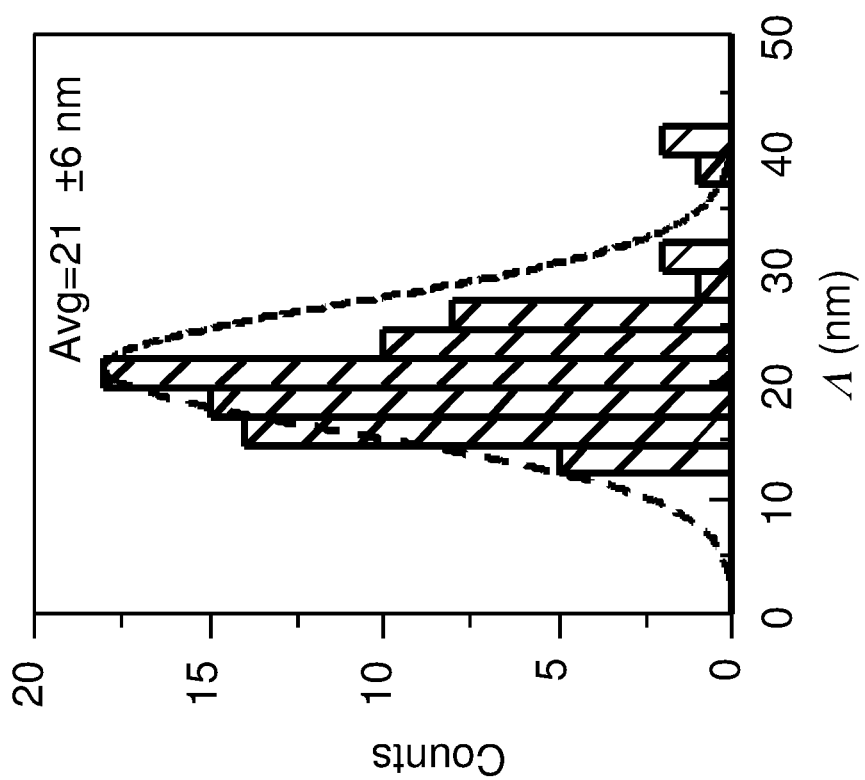
FIG. 14 is a graph illustrating the self-limiting pitch separation of CNTs achieved by a dielectrophoresis process using a single electrode and the conductive layer of the substrate according to at least one embodiment of the invention.

Referring to FIG. 13B, the attractive forces (dashed line) applied to neighboring CNTs is maintained when depositing CNTs during the conventional dielectrophoresis processes until a height (H), e.g., 20 nm, of a multi-layer arrangement of CNTs screens the electric field generated between the two metal electrodes. In contradistinction to the conventional dielectrophoresis processes, the electric field generated by only a single electrode 106' and the conductive substrate 104 is a fringing field formed between the top surface of the single electrode 106 and the conductive layer 104. Upon depositing one or more CNTs 116 on the upper surface of the dielectric film 112, the flinging field is effectively screened off. Accordingly, the attractive force upon neighboring CNTs is effectively driven to 0 throughout the dielectrophoresis process such that the height (H) of the CNTs is kept at approximately 0 nm and a multi-layer arrangement (i.e., stacking) of the CNTs is prevented. In addition, the screening effect realized by neighboring CNTs 116 limits the pitch separation to an average pitch ranging, for example, from approximately 15 nm to approximately 30 nm as illustrated in FIG. 14.

Figure 15:
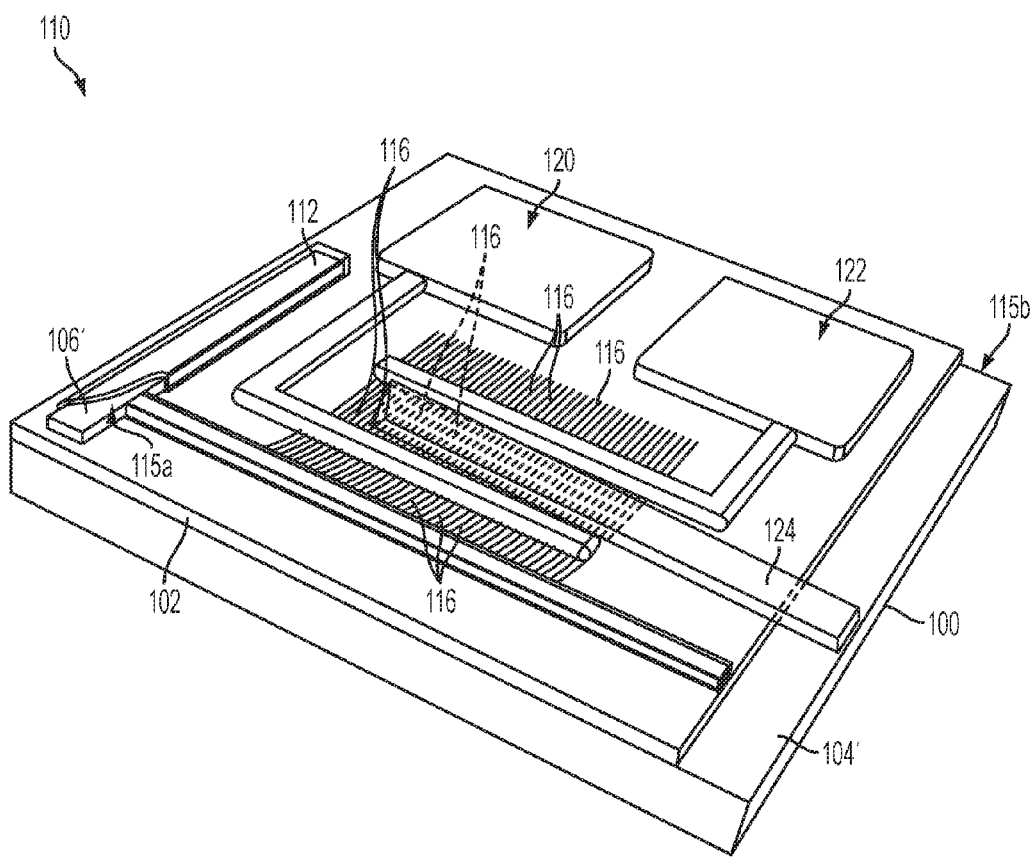
FIG. 15 illustrates a semiconductor device including a plurality of self-aligned CNTs arranged in a uniform monolayer array that defines gate channels between a source contact and a drain contact according to a non-limiting embodiment of the invention.

Following the dielectrophoretic process to self-align the CNTs 116, it is appreciated that various additional semiconductor device elements may be formed on the upper surface of the conformal dielectric film 112. Referring to FIG. 15, for example, the additional semiconductor device elements include, but are not limited to, a source contact 120, a drain contact 122, and a gate structure 124. The CNTs 116 are aligned between the source contact 120 and the drain contact 122 as further illustrated in FIG. 15. A first end of the CNTs 116 is in contact with the source contact 120 and a second opposing end of the CNTs 116 is in contact with the drain contact 122. In this manner, the CNTs 116 can be implemented as gate channels interposed between the source contact 120 and the drain contact 122. The gate structure 124 can be formed on the CNTs 116 to form a gate contact 124 of the semiconductor device 110. It is further appreciated that the electrode 106', or portions thereof used to align the CNTs 116, can be removed from the semiconductor device 110 after completing the self-limiting arrangement of the CNTs 116. After assembly, these nanotube arrays can also be transferred to another target substrate where the semiconductor devices can be fabricated.

Unlike conventional CNT alignment methods that require forming at least two separate and independent metal electrodes on a substrate to arrange multi-layered CNTs, at least one non-limiting embodiment of the invention provides a method of self-aligning a plurality of CNTs deposited on a semiconductor substrate using a single contiguous electrode and the conductive layer (e.g., silicon layer) of the semiconductor substrate. In addition, at least one feature of the invention includes performing an electrical dielectrophoresis process that induces a plurality of SWNTs into a self-aligned arrangement of monolayer aligned arrays having both tight and uniform pitch separation using only a single contiguous electrode and the semiconductor substrate (e.g. silicon). The field-effect using only a single electrode and the conductive substrate (e.g., silicon substrate) provides an unexpected self-limiting mechanism that arranges SWNTs into mono-layer arrays while limiting pitch separation between adjacent SWNTs to an average pitch ranging, for example, from approximately 15 nm to approximately 30 nm.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a semiconductor device, the method comprising:
   forming a dielectric layer on an upper surface of a conductive substrate, and forming a single contiguous electrode on the dielectric layer;
   forming a conformal dielectric film on an upper surface of the electrode and on an upper surface of the dielectric layer; and
   performing a selective etching process that exposes a portion of the electrode and a portion of the conductive substrate,
   wherein forming the single contiguous electrode comprises:
      forming an electrically conductive bar electrode extending along a first direction of the conductive substrate;
      forming a first electrically conductive contact branch that is integral with the electrically conductive bar electrode, the first electrically conductive contact branch extending from the electrically conductive bar along a second direction that is perpendicular to the first direction; and
      forming a second electrically conductive contact branch that is integral with the electrically conductive bar electrode, the second electrically conductive contact branch extending from the electrically conductive bar along the second direction and parallel with respect to the first electrically conductive contact branch such that the second electrically conductive contact branch is spaced apart from the first electrically conductive contact branch.

2. The method of claim 1, wherein the selective etching process is a selective dielectric etching process that is selective to dielectric material.

3. The method of claim 2, wherein the selective etching process includes forming a first opening that extends through the dielectric film to expose the portion of the electrode, and forming a second opening that extends through both the dielectric film and the dielectric layer to expose the portion of the conductive substrate.

4. The method of claim 3, wherein the performing a selective etching process further comprises:

forming a masking layer on an upper surface of the dielectric film;

patterning the masking layer to expose a portion of the dielectric film; and performing the selective dielectric etching process to form the first opening based on a first pattern formed in the masking layer and to form the second opening based on a second pattern formed in the masking layer.

5. The method of claim 4, wherein the exposed portion of the electrode is configured to receive a voltage via the first opening and the conductive substrate is configured to receive a ground potential via the second opening.

6. The method of claim 5, wherein the electrode comprises metal and the conductive substrate comprises silicon (Si).

7. The method of claim 1, wherein the selective etching process preserves a portion of the dielectric layer between the first and second electrically conductive contact branches to define a carbon nanotube (CNT) arrangement region configured to self-arrange a plurality of CNTs.

* * * * *